(12) United States Patent
Sutardja

(10) Patent No.: US 7,835,710 B2
(45) Date of Patent: Nov. 16, 2010

(54) VARIABLE POWER ADAPTIVE TRANSMITTER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 666 days.

(21) Appl. No.: 11/368,308

(22) Filed: Mar. 3, 2006

(65) Prior Publication Data
US 2007/0178860 A1 Aug. 2, 2007

Related U.S. Application Data

(60) Provisional application No. 60/773,033, filed on Feb. 14, 2006, provisional application No. 60/763,041, filed on Jan. 27, 2006.

(51) Int. Cl.
  H04B 1/04 (2006.01)
  H01Q 11/12 (2006.01)
(52) U.S. Cl. ............... 455/127.5; 455/114.2; 455/127.2; 375/296
(58) Field of Classification Search ............... 455/114.2, 455/114.3, 127.1, 127.2, 127.5, 127.3, 127.4, 455/91; 375/297, 296
  See application file for complete search history.

(56) References Cited

U.S. PATENT DOCUMENTS

| | | | |
|---|---|---|---|
| 5,420,536 A | 5/1995 | Faulkner et al. | |
| 6,043,707 A | 3/2000 | Budnik | |
| 6,163,706 A * | 12/2000 | Rozenblit et al. | ............ 455/522 |
| 6,714,071 B1 | 3/2004 | Page | |
| 6,967,533 B2 * | 11/2005 | Vilhonen et al. | ............ 330/254 |
| 7,062,236 B2 * | 6/2006 | Midtgaard et al. | ........... 455/126 |
| 7,340,228 B2 * | 3/2008 | Monroe et al. | ........... 455/127.1 |
| 2003/0076172 A1 * | 4/2003 | Tichauer | ..................... 330/285 |
| 2005/0110562 A1 | 5/2005 | Robinson et al. | |
| 2006/0087373 A1 | 4/2006 | Kim | |
| 2006/0199553 A1 * | 9/2006 | Kenington | ............... 455/127.1 |

FOREIGN PATENT DOCUMENTS

| | | |
|---|---|---|
| EP | 1 536 556 | 6/2005 |
| WO | WO 03/056698 | 7/2003 |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

(Continued)

*Primary Examiner*—Edward Urban
*Assistant Examiner*—Christian A Hannon

(57) ABSTRACT

A circuit comprises a delay module that receives a digital transmit signal and that generates a delayed transmit signal. A first digital to analog converter converts the delayed transmit signal to an analog transmit signal. An analog output circuit amplifies the analog transmit signal. An envelope generating module generates an envelope signal based on amplitude information in the digital transmit signal. A supply adjustment module supplies a voltage supply reference when the envelope signal is less than a threshold and boosts the bias voltage of the analog output circuit above the voltage supply reference when the envelope signal is greater than the threshold.

34 Claims, 14 Drawing Sheets

OTHER PUBLICATIONS

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11g/D2.8, May 2002 (Supplement to ANSI/IEEE Std 802.11, 1999 Edition) DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE Std 802.11h—2003 (Amendment to IEEE Std 802.11, 1999 Edition (Reaff 2003)); as amended by IEEE Stds 802.11a-1999, 802.11b-1999, 802.11b-1999/Cor 1-2001, 802.11d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 75 pages.

802.11n; IEEE P802.11-04/0889r6; Wireless LANs, TGn Sync Proposal Technical Specification; 131 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE P 802.20 V 14, Jul. 16, 2004, Draft 802.20 Permanent Document, System Requirements for IEEE 802.20 Mobile Broadband Wireless Access Systems—Version 14, 24 pages.

Communication from the European Patent Office with the extended European Search Report dated Jul. 24, 2007 for Application No. 07 000 803.2-2215; 10 pages.

Communication from the European Patent Office with the extended European Search Report dated Apr. 18, 2007 for Application No. 07 000 789.3-2215; 6 pages.

\* cited by examiner

VARIABLE POWER ADAPTIVE TRANSMITTER

CROSS-REFERENCE TO RELATED APPLICATIONS

This application claims the benefit of U.S. Provisional Application No. 60/773,033 filed on Feb. 14, 2006, and U.S. Provisional Application No. 60/763,041, filed on Jan. 27, 2006. The disclosures of the above applications are hereby incorporated by reference in their entirety.

FIELD OF THE INVENTION

The present invention relates to communication systems, and more particularly to transmitters in network interfaces and other devices.

BACKGROUND OF THE INVENTION

Referring now to FIG. 1, an exemplary network 10 is shown to include one or more wireless network devices 20-1, 20-2, ..., and 20-X (collectively wireless network devices 20) and/or one or more wired network devices 24-1, 24-2, ..., and 24-Y (collectively wired network devices 24). The wireless network devices 20 wirelessly communicate data packets with an access point 30. The wired network devices 24 communicate data packets over cable, fiber or other media with a router 40. The access point 30 also communicates with the router 40. The router 40, in turn, communicates with a broadband modem 44, which communicates with a service provider 48. The service provider 48, in turn, provides access to a distributed communications network 50 such as the Internet.

Referring now to FIG. 2, an exemplary wireless network device 20 is shown. The wireless network device 20 typically includes a host 58 and a wireless network interface 60. The wireless network interface 60 typically includes a wireless physical layer device (PHY) 62, which includes a transceiver 64 including a transmitter 66 and a receiver 68. The wireless network interface 60 also includes a media access controller (MAC) 70 and/or other components (not shown).

Referring now to FIG. 3, an exemplary wired network device 24 is shown. The wired network device 24 typically includes a host 78 and a wired network interface 80. The wired network interface 80 typically includes a wired physical layer device (PHY) 82, which includes a transceiver 84 including a transmitter 86 and a receiver 88. The wireless network interface 60 also includes a media access controller (MAC) 90 and/or other components (not shown).

As described above, during use the transmitters 66 and 86 receive data that is to be transmitted on a respective medium. A supply voltage of the network interface may pose some limitations on the dynamic range of the transmitters 66 and 86 relative to voltage references that are used to supply the transmitter.

Referring now to FIGS. 4 and 5, the transmitters 66 and 86 in FIGS. 2 and 3 typically receive a supply voltage that can swing between $+V_s$ and $-V_s$. In this case, $V_s$ is less than or equal to a supply voltage such as $V_{dd}$. However, when a transmitter signal that is to be output by the transmitter 100 has an amplitude that is higher than the voltage swing of the supply voltage, clipping may occur, for example at 110 and 112 in FIG. 5. Increasing the supply voltage tends to reduce clipping. However, increasing the supply voltage also tends to increase the power dissipation of the device.

SUMMARY OF THE INVENTION

A circuit comprises a delay module that receives a digital transmit signal and that generates a delayed transmit signal. A first digital to analog converter converts the delayed transmit signal to an analog transmit signal. An analog output circuit amplifies the analog transmit signal. An envelope generating module generates an envelope signal based on amplitude information related to the digital transmit signal. A supply adjustment module supplies a voltage supply reference when the envelope signal is less than a threshold and boosts the bias voltage of the amplifier above the voltage supply reference when the envelope signal is greater than the threshold.

In other features, a second digital to analog converter converts the envelope signal to an analog envelope signal. The first digital to analog converter has a higher resolution than the second digital to analog converter. A third digital to analog converter receives the envelope signal and selectively boosts a bias current for the amplifier. The bias current increases when the envelope signal exceeds the threshold. The wireless network interface is compliant with at least one of IEEE section 802.11, 802.11a, 802.11b, 802.11g, 802.11h, 802.11n, 802.16, and 802.20.

A circuit comprises an analog output module that receives a bias signal and a control signal. A delay module receives a first signal and that generates a delayed first signal. A control module receives the delayed first signal and generates the control signal based thereon. An envelope generating module receives a second signal including amplitude information related to the first signal and generates an envelope signal that selectively increases the bias signal to the analog output module when the envelope signal exceeds a predetermined threshold and before a corresponding portion of the first signal is received by the analog output module.

In other features, the first signal includes a digital modulated carrier signal. A rectifier module that rectifies the digital modulated carrier signal and outputs the rectified modulated carrier signal to the envelope generating module. A digital to analog converter converts the envelope signal to an analog envelope signal. The envelope signal has a slower rise time than a fastest rise time of the first signal. The analog output module comprises a power amplifier. The control module includes a transmitter module.

In other features, a switch communicates with a first reference voltage and is controlled by the envelope generating module. A capacitance communicates with an output of the envelope generating module and the switch. An inductance communicates with the analog output module and the capacitance. A matching network communicates with the analog output module. An antenna communicates with the matching network. The envelope generating module receives the first signal and generates the envelope signal based on the first signal. The delay circuit delays the modulated carrier signal. An upconverter upconverts the delayed modulated carrier signal.

A circuit comprises analog output means for receiving a bias signal and a control signal. Delay means receives a first signal and generates a delayed first signal. Control means receives the delayed first signal and generates the control signal based thereon. Envelope generating means receives a second signal including amplitude information related to the first signal and generates an envelope signal that selectively increases the bias signal to the analog output means when the envelope signal exceeds a predetermined threshold and before a corresponding portion of the first signal is received by the analog output means.

In other features, the first signal includes a digital modulated carrier signal. Rectifier means rectifies the digital modulated carrier signal and outputs the rectified digital modulated carrier signal to the envelope generating means. Digital to analog converting means converts the envelope signal to an analog envelope signal. The envelope signal has a slower rise time than a fastest rise time of the first signal. The analog output means comprises power amplifying means for amplifying. The control means includes transmitting means for transmitting. Switching means for switching communicates with a first reference voltage and is controlled by the envelope generating means. Capacitance means provides capacitance and communicates with an output of the envelope generating means and the switching means. Inductance means provides inductance and communicates with the capacitance means and the analog output means.

In yet other features, matching network means for matching communicates with the analog output means. An antenna communicates with the matching network means. The envelope generating means receives the first signal and generates the envelope signal based on the first signal. The delay means delays the modulated carrier signal. An upconverting means upconverts the delayed modulated carrier signal.

A method comprises receiving a bias signal and a control signal at an analog output module; receiving and delaying a first signal; generating the control signal based on the delayed first signal; receiving a second signal including amplitude information related to the first signal; and generating an envelope signal based on the second signal that selectively increases the bias signal to the analog output module when the envelope signal exceeds a predetermined threshold and before a corresponding portion of the first signal is received by the analog output module.

In other features, the first signal includes a digital modulated carrier signal. The method includes rectifying the digital modulated carrier signal and outputting the rectified digital modulated carrier signal to the envelope generating module. The method includes converting the envelope signal to an analog envelope signal. The envelope signal has a slower rise time than a fastest rise time of the first signal. The method further includes generating the envelope signal based on the first signal. The method further includes delaying the modulated carrier signal and upconverting the delayed modulated carrier signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
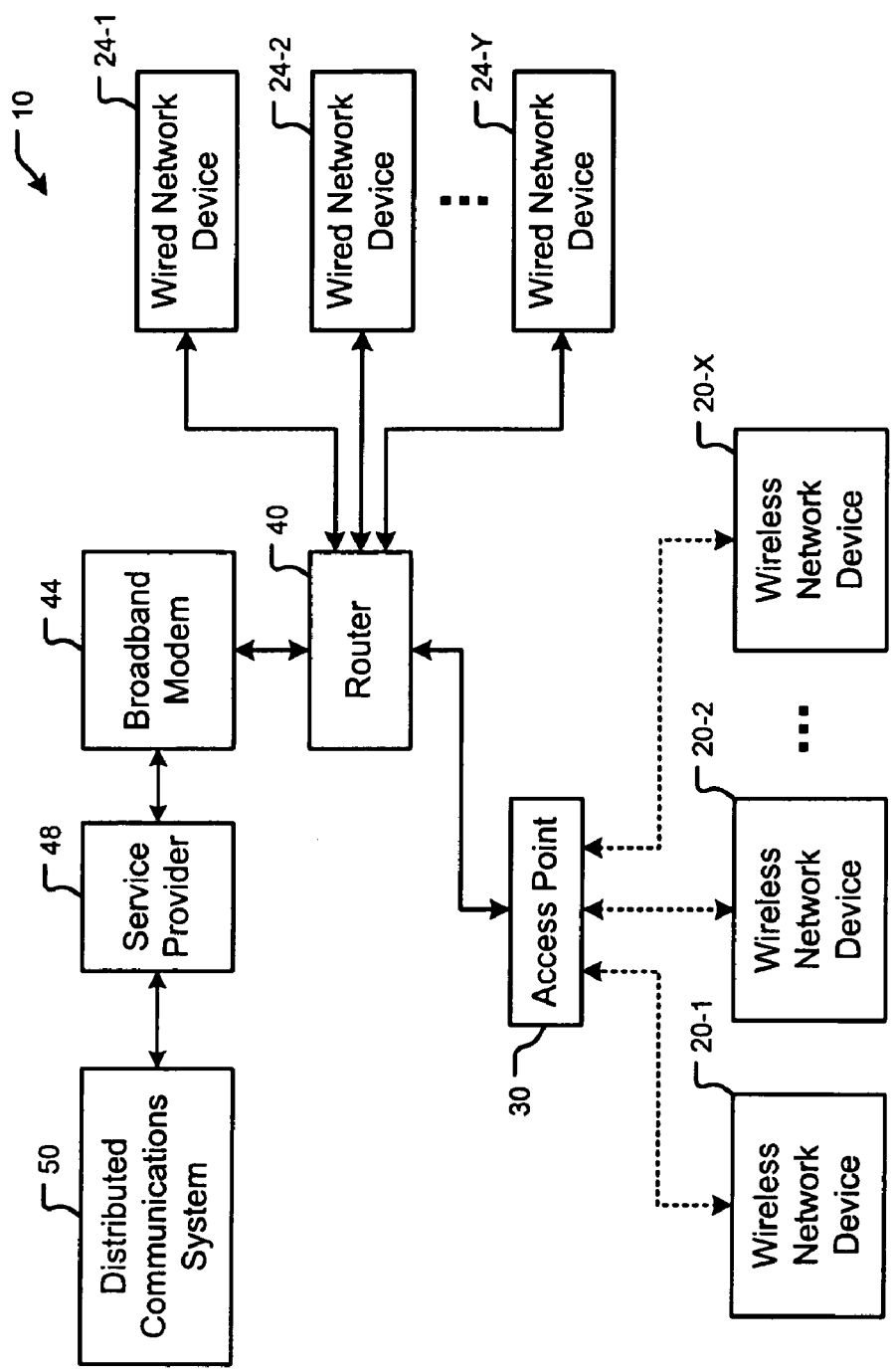
FIG. 1 is functional block diagram of an exemplary wireless network according to the prior art.
Figure 3:
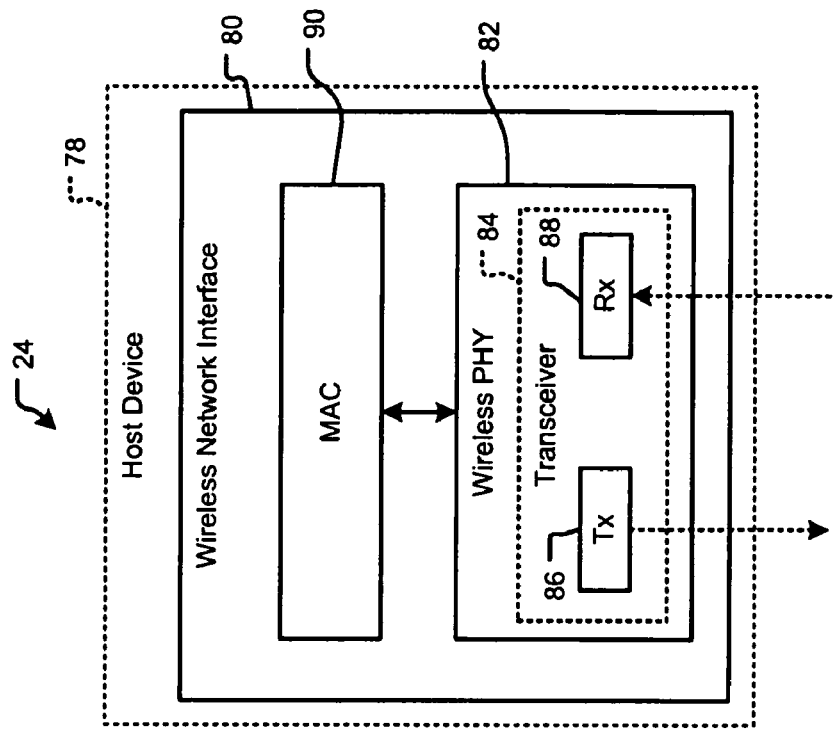
FIG. 3 is a functional block diagram of an exemplary wired network device of FIG. 1.
Figure 2:
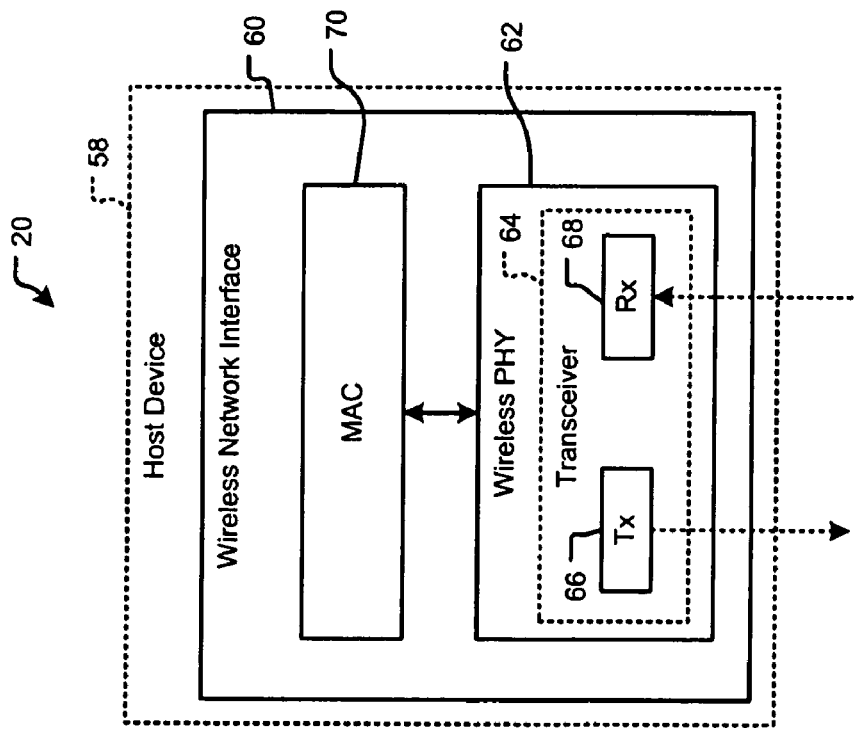
FIG. 2 is a functional block diagram of an exemplary wireless network device of FIG. 1.
Figure 4:
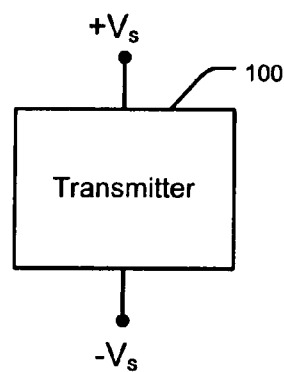
FIG. 4 is a functional block diagram of a transmitter that is powered by a voltage source according to the prior art.
Figure 5:
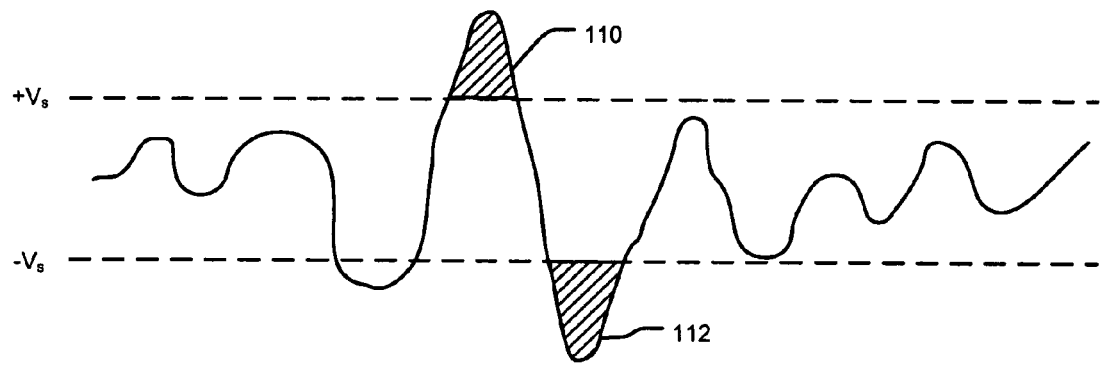
FIG. 5 is an exemplary waveform of a wireless signal transmitted by the transmitter of FIG. 4.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 6A:
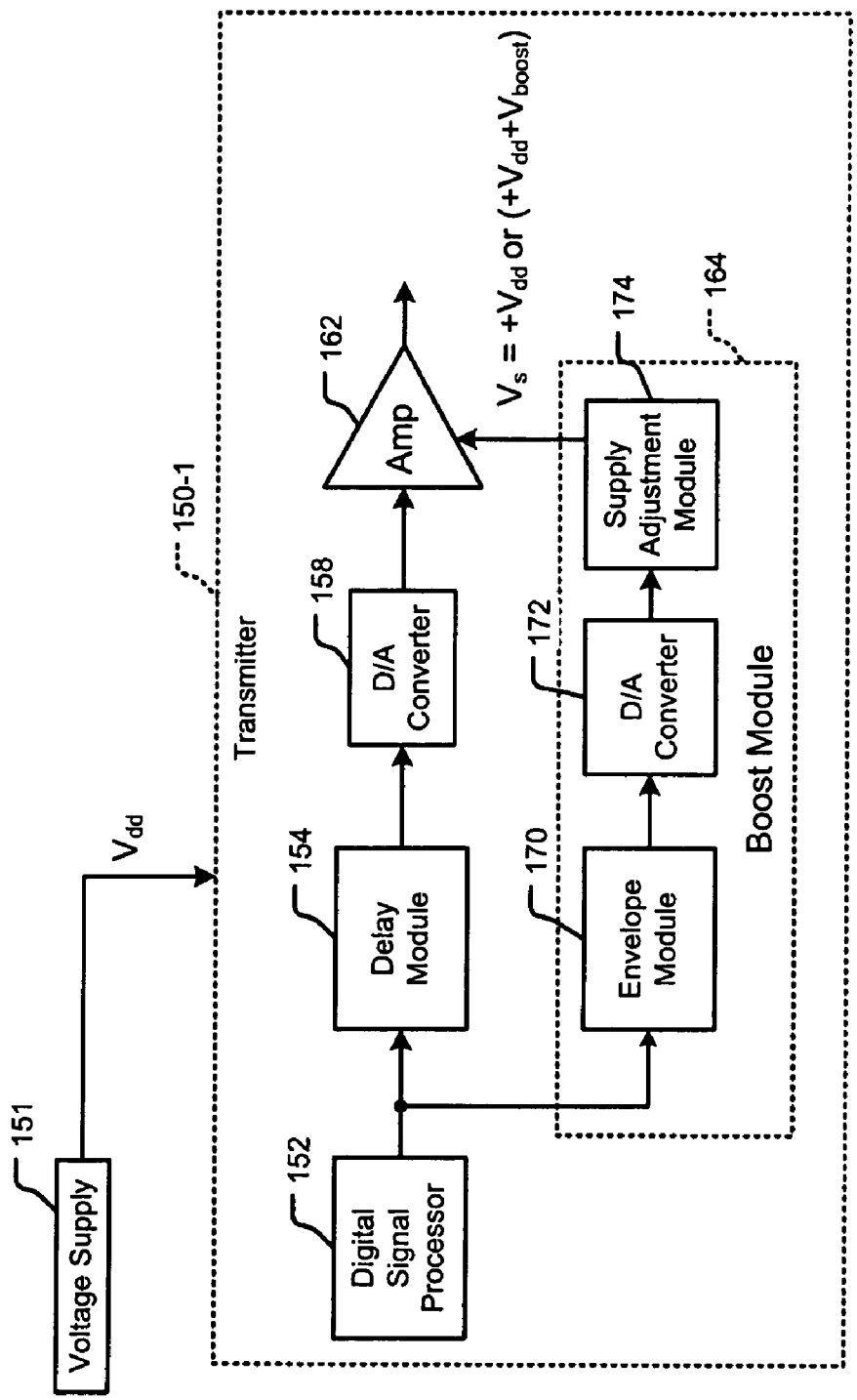
FIGS. 6A and 6B are functional block diagrams of exemplary adaptive transmitters according to the present invention.
Figure 6B:
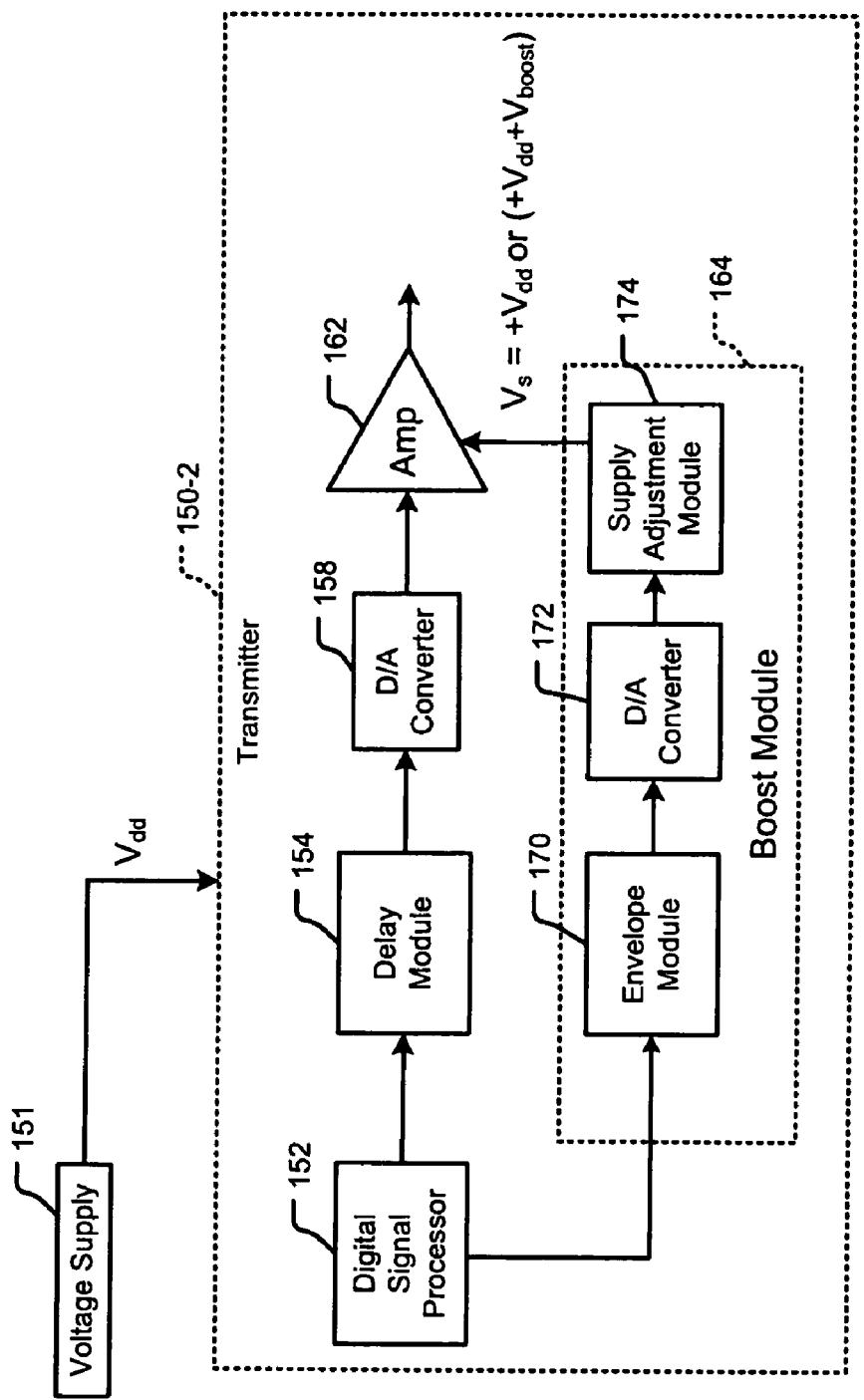

Referring now to FIGS. 6A and 6B, adaptive transmitters 150-1 and 150-2 (collectively adaptive transmitters 150) according to the present invention are shown. Components of the adaptive transmitter 150 receive a voltage reference $V_s$. Unlike conventional systems, the voltage reference $V_s$ can temporarily be greater than the supply voltage $V_{dd}$. Therefore, some components within the transmitter can be temporarily driven higher than the voltage reference $V_{dd}$ to avoid clipping and increase dynamic range while maintaining relatively low power dissipation.

In FIG. 6A, the adaptive transmitter 150-1 includes a digital signal processor (DSP) 152 that outputs a transmit signal that is to be transmitted. A delay module 154 delays the transmit signal by a predetermined delay and/or a variable delay that can be adjusted. A digital to analog converter 158 converts the delayed transmit signal to an analog transmit signal. The analog transmit signal is output to an analog output circuit such as an amplifier 162, which amplifies the analog transmit signal. While an amplifier is shown, any analog output circuit that requires a bias voltage can be used.

A boost module 164 receives the transmit signal (or amplitude information related to the transmit signal) and selectively increases voltage $V_s$ supplied to the amplifier and/or any other analog output circuit above a threshold such as the voltage supply level $V_{dd}$ when the analog transmit signal exceeds the voltage supply level or any other threshold. In contrast to causal systems, the voltage boost to the amplifier 162 occurs before the amplifier 162 receives the corresponding transmit signal that exceeded the threshold. Therefore, clipping can be avoided unlike in causal systems where clipping may be reduced but not avoided. The envelope signal has also may have a rise time that is slower than the fastest rise time of the transmit signal.

The boost module 164 comprises an envelope module 170, a digital to analog converter 172 and a supply adjustment module 174. The transmit signal may be output to an envelope module 170. The envelope module 170 generates an envelope signal that is based on the transmit signal. The envelope signal tracks positive and/or negative peaks of the transmit signal at a lower bandwidth. The envelope signal is output to a digital to analog converter 172, which converts the envelope signal to an analog signal. The analog signal from the digital to analog converter 172 is output to a supply adjustment module 174. The supply adjustment module 174 generates a variable voltage supply or bias for the amplifier 162.

When the envelope signal is less than the threshold signal, the supply adjustment module 174 supplies $V_s=V_{dd}$. When the envelope signal is greater than the threshold signal, the supply adjustment module 174 temporarily boosts $V_s$ above $V_{dd}$. The boost voltage $V_{Boost}$ allows the amplifier in the transmitter to track the transmit signal without clipping the transmit signal. The delay provided by the delay module 154 allows the supply adjustment module 174 to generate the additional voltage required to boost $V_s$ above $V_{dd}$. The digital to analog converter 158 may have a higher resolution and/or bandwidth than the digital to analog converter 172.

As can be appreciated, the envelope signal generator does not need to receive the same signal as the delay module 154 and D/A converter 158 as shown in FIG. 6A. For example, the digital signal processor 152 can output amplitude information related to the digital signal to the envelope signal generator and the transmit signal (including additional information) to the delay module 154 and D/A converter 158. Other types of signals may be used as well.

Figure 7A:
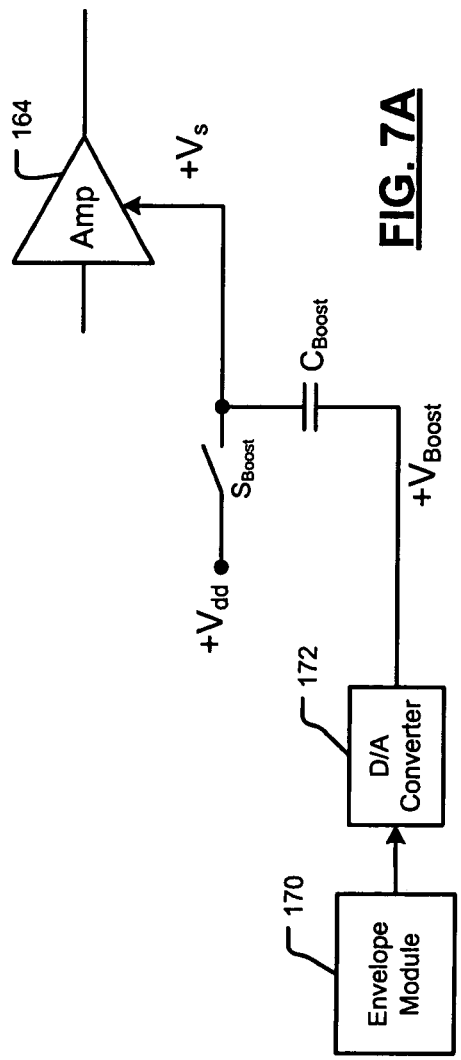
FIG. 7A is an exemplary functional block diagram and electrical schematic of a supply adjustment module.
Figure 7B:
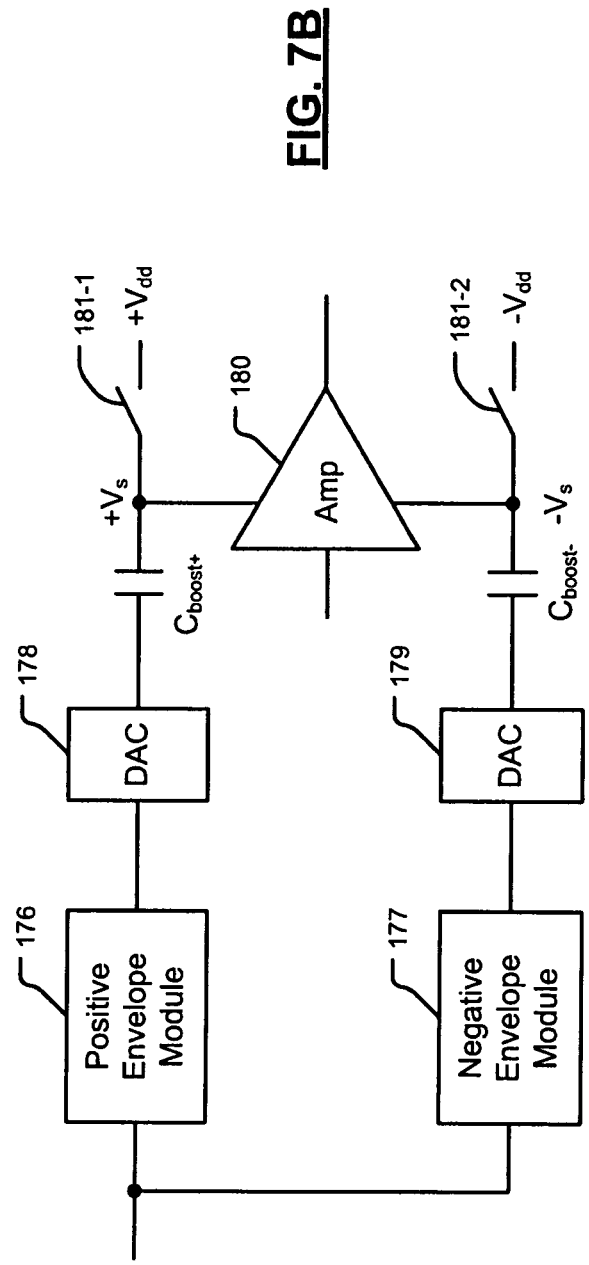
FIG. 7B is an exemplary functional block diagram and electrical schematic of an assymetrical supply adjustment module.
Figure 7C:
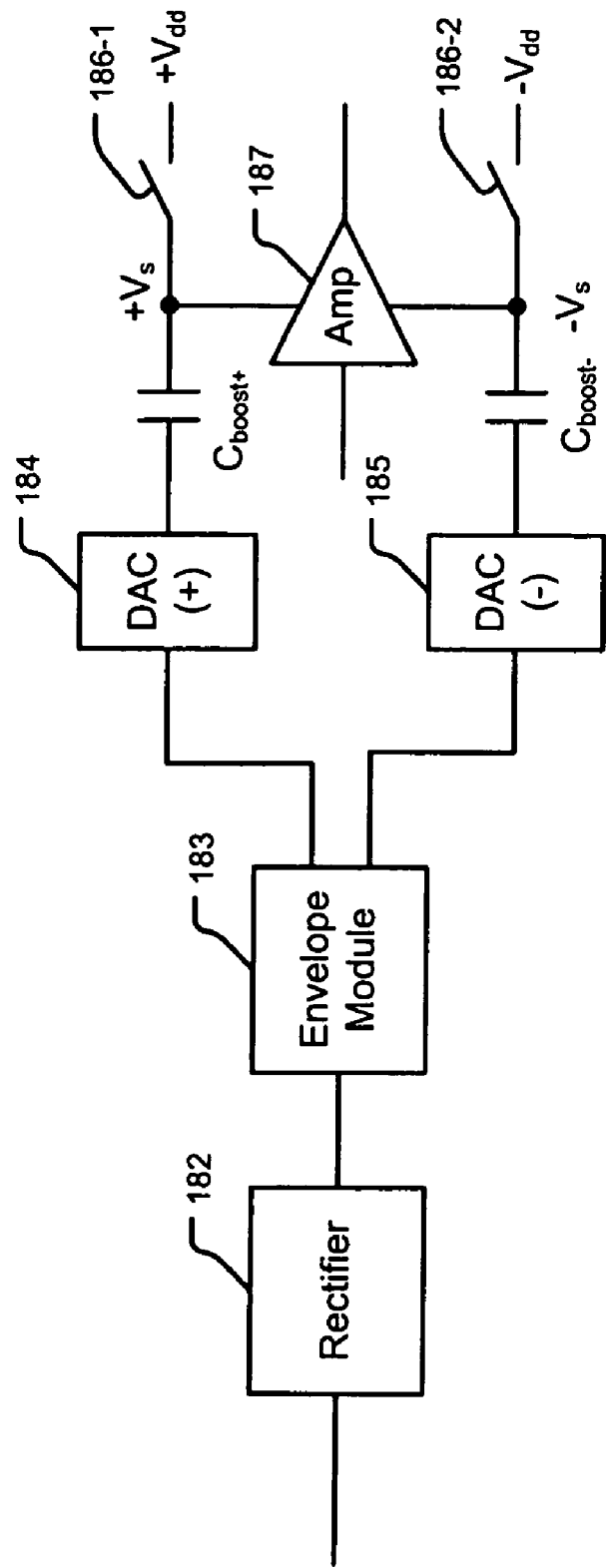
FIG. 7C is an exemplary functional block diagram and electrical schematic of a symmetrical supply adjustment module.
Figure 8A:
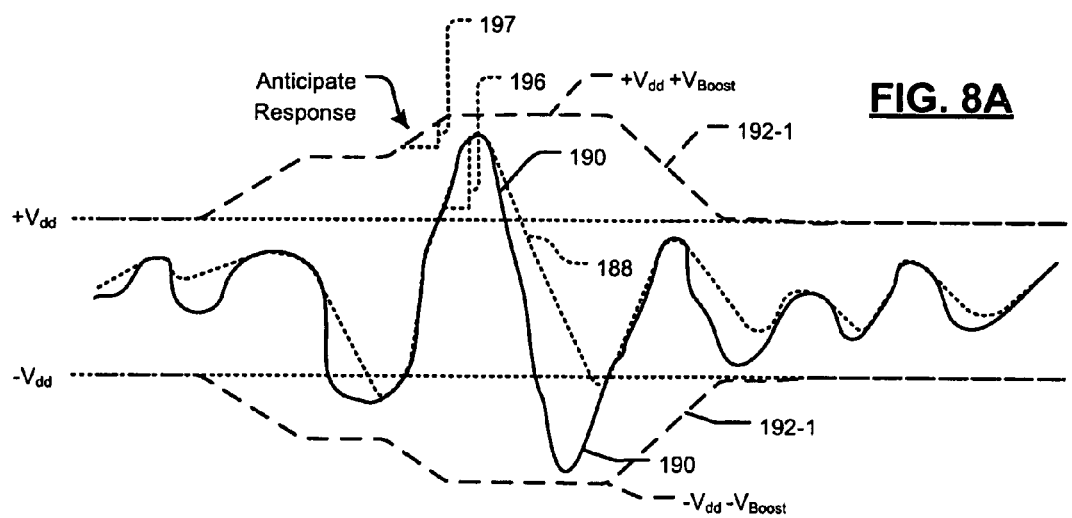
FIG. 8A illustrates a symmetrical boosted waveform.

Referring now to FIGS. 7A-7C and 8A-8C, an exemplary supply adjustment module 174 is shown to include a switch $S_{Boost}$ and a boost capacitor $C_{Boost}$ that receives a boost voltage from the digital to analog converter 172. When the envelope signal is less than the threshold signal, the switch $S_{Boost}$ is closed and the supply adjustment module 174 supplies $V_s=V_{dd}$. When the envelope signal is greater than the threshold signal, the switch $S_{Boost}$ is opened and the supply adjustment module 174 supplies $V_s=V_{dd}+V_{Boost}$. Energy stored in the capacitor $C_{Boost}$ will supply bias voltages and/or current to the amplifier and/or other analog output circuits. In FIG. 8A, the boost voltage temporarily increases the voltage supplied ($V_s$) above $V_{dd}$ and reduces or prevents clipping of the transmitter signal.

In FIG. 7B, the digital signal is output to positive and negative envelope generating modules 176 and 177, which generate positive and negative envelope signals, respectively.

Outputs of the positive and negative envelope generating modules 176 and 177 are input to digital to analog converters (DACs) 178 and 179, respectively. Outputs of the DACs 178 and 179 communicate with positive and negative boost capacitors $C_{boost+}$ and $C_{boost-}$, respectively. Switches 181-1 and 181-2 are operated as described above to selectively bias an amplifier 180 with $V_{dd}$ or a boost voltage.

In FIG. 7C, the digital signal is fed to a rectifier 182 (or absolute value circuit) that rectifies the signal. If used, the absolute value circuit may selectively change sign bits to provide an absolute value. An envelope module outputs positive and negative envelope signals to DACs 184 and 185, respectively. Outputs of the DACs 184 and 185 communicate with positive and negative boost capacitors $C_{boost+}$ and $C_{boost-}$, respectively. Switches 186-1 and 186-2 are operated as described above to selectively bias an amplifier 187 with $V_{dd}$ or a boost voltage.

Figure 8B:
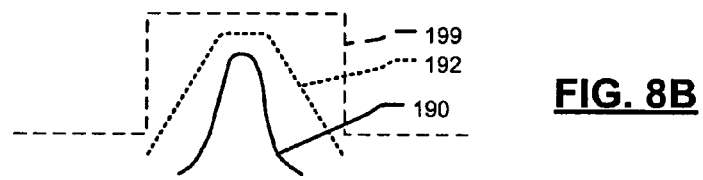
FIG. 8B illustrates the slower signal rise time of the envelope signal.

The circuit in FIG. 7B generates a symmetrical boosted waveform that is shown in FIG. 8A. In FIGS. 8A and 8B, the transmitter signal 190 has a higher bandwidth than the envelope signal 192. The envelope signal 192 anticipates the transmitter signal 190. In other words, the envelope signal 192 does not merely follow the increase of the transmitter signal 190 as would be the case for traditional peak envelope detector signals generally illustrated at 188. Rather, the envelope signal 192 begins to increase in anticipation of the increase in the transmitter signal 190 and may have a higher amplitude than the traditional peak envelope detector signal. Furthermore, the bandwidth of the envelope signal 192 is lower than the bandwidth of the transmitter signal 190. In other words, a rise time of the envelope signal 192 is greater than a fastest rise time of the transmitter signal 190. Stated another way, a slope 197 of the envelope signal in FIG. 8A will be less than a slope 196 of a corresponding (and delayed) portion of the transmitter signal 190. Using an envelope signal having a faster response or a step response (such as the one shown at 199 in FIG. 8B) may tend to cause high frequency noise.

Figure 8C:
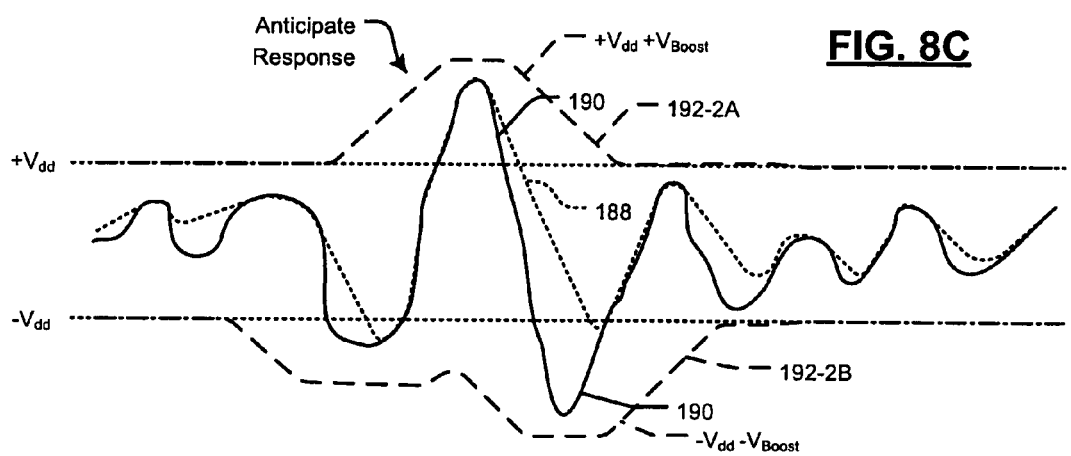
FIG. 8C illustrates an asymmetrical boosted waveform.

In FIG. 8C, an asymmetrical waveform that can be generated by the circuit in FIG. 7C is shown. The boost that is generated is different for positive and negative portions of the signal. Therefore, the positive and negative bias voltages for the differential amplifier may also be different.

Figure 9:
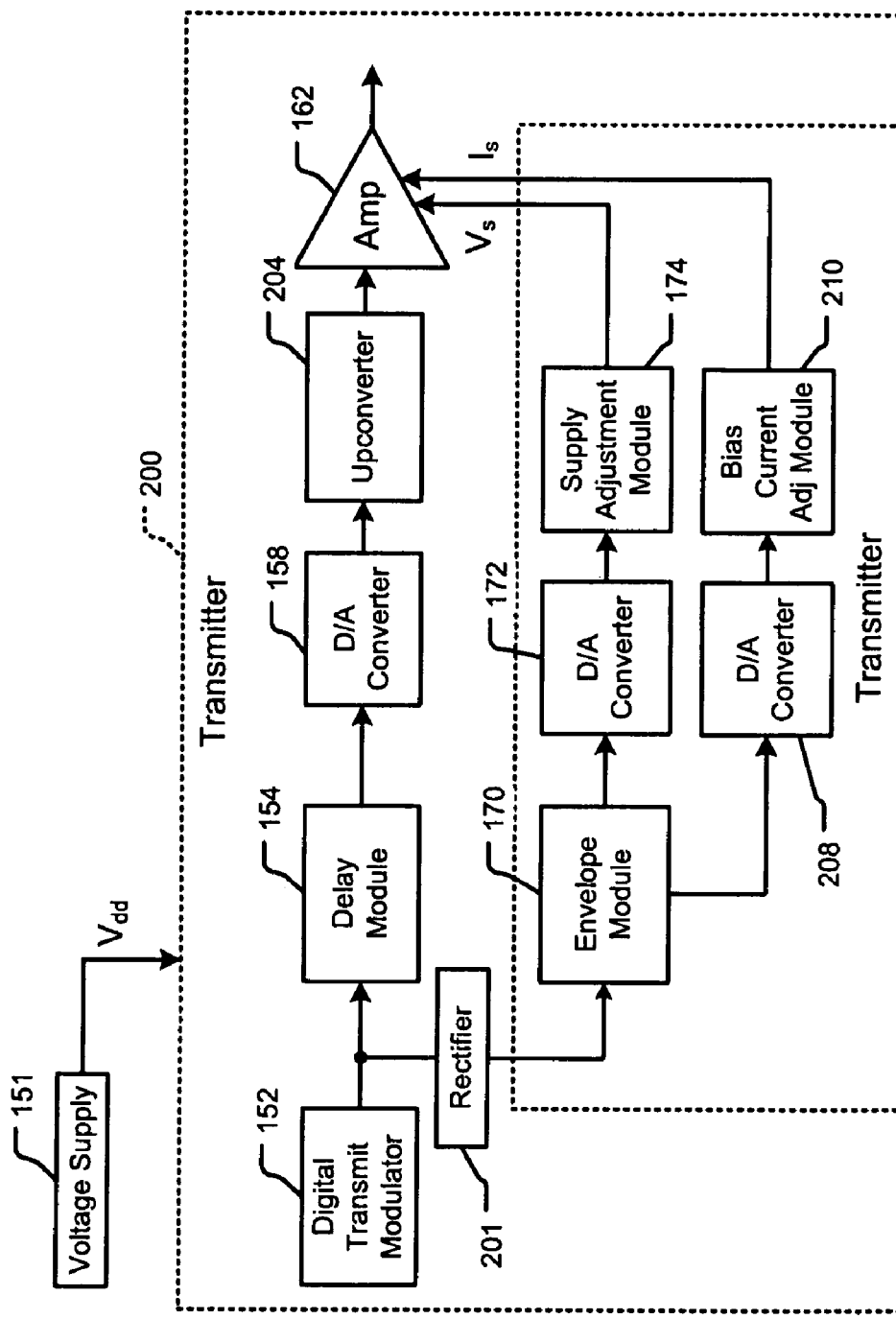
FIG. 9 is an exemplary functional block diagram of an exemplary RF amplifier with boosting.

Referring now to FIG. 9, an adaptive transmitter 200 can be implemented in an RF amplifier for a wireless transmitter. Components of the adaptive transmitter 200 receive a voltage supply $V_{dd}$. Some components within the transmitter, however, can be temporarily driven higher than the voltage supply $V_{dd}$. A digital transmit modulator 202 outputs the transmit signal to the delay module 154 and to a rectifier 201 (or absolute value module), which outputs the rectified digital signal to the envelope module 170. The digital to analog converter 158 converts the delayed transmit signal to an analog transmit signal. The analog transmit signal is output to an upconverter 204 that upconverts the signal. The upconverted signal is output the amplifier 162, which amplifies the signal.

The envelope module 170 generates an envelope signal that is based on the transmit signal and/or a threshold signal. The envelope signal is output to a digital to analog converter 172, which converts the envelope signal to an analog signal. The analog signal from the digital to analog converter 172 is output to a supply adjustment module 174. The supply adjustment module 174 generates a variable voltage supply for the amplifier 162.

When the envelope signal is less than the threshold signal, the supply adjustment module 174 supplies $V_s=V_{dd}$. When the envelope signal is greater than the threshold signal, the supply adjustment module 174 temporarily boosts $V_s$ above $V_{dd}$. The delay provided by the delay module 154 allows the supply adjustment module 174 to generate the additional voltage required to boost $V_s$ above $V_{dd}$. A digital to analog converter 208 also receives the envelope signal and generates an RF bias current. The bias current selectively biases the amplifier 162. The bias current may be provided at the same time that the boost voltage is provided and/or may continually provide an adaptive bias current to the amplifier 162. A bias adjustment module 210 adjusts an RF bias current to the amplifier based on the envelope signal.

Suitable applications include wireless network devices and wired network devices. The network devices can be VDSL or VDSL2 compliant. The wireless network devices can be compliant with IEEE standards 802.11, 802.11a, 802.11b, 802.11g, 802.11h, 802.11n, 802.16, and 802.20 and/or with Bluetooth and cellular phones, for example those that are compliant with GSM 4G.

Figure 10A:
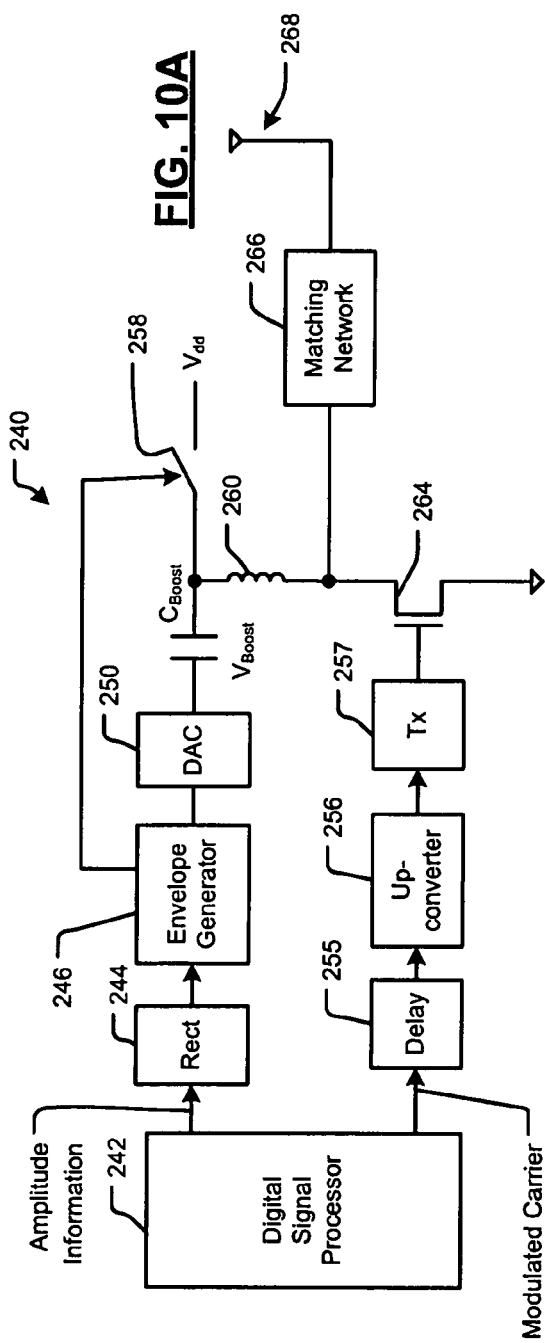
FIG. 10A is a functional block diagram and electrical schematic of another exemplary adaptive transmitter.
Figure 10B:
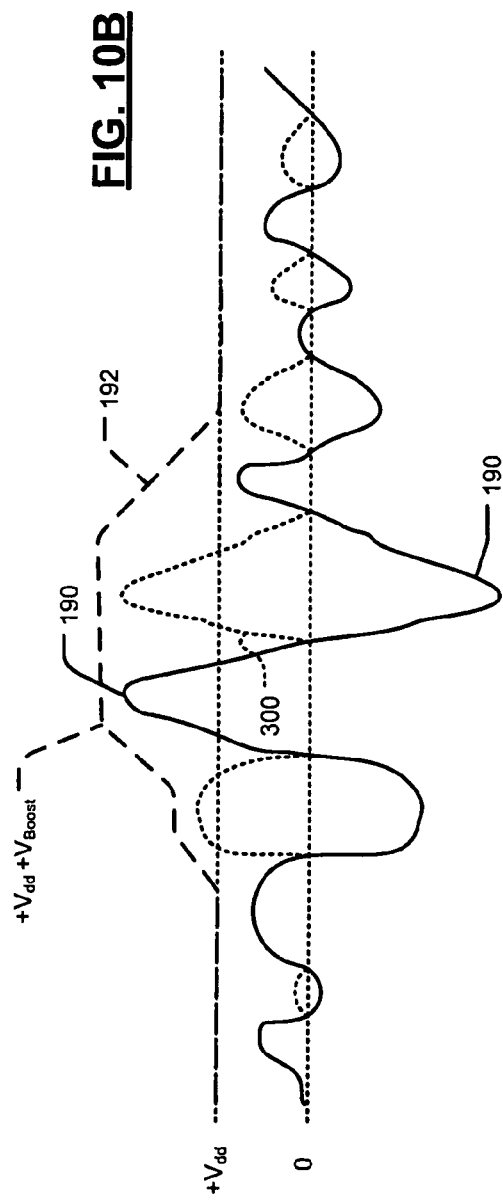
FIG. 10B illustrates a rectified and boosted waveform.

Referring now to FIGS. 10A-10B, a transmitter circuit 240 includes a digital signal processor (DSP) 242 that generates a first signal containing amplitude information and a modulated carrier signal. A rectifier 244 (or absolute value circuit) rectifies the signal and outputs the signal to an envelope generator module 246, which generates an envelope signal as described above. A DAC 250 converts the envelope signal to an analog envelope signal and generates a boost voltage $V_{Boost}$ across a capacitor $C_{Boost}$. The envelope generator module 246 also generates a control signal that selectively opens and closes a switch 258, which is connected to $V_{dd}$. The switch is operated as described above.

A delay module 255 receives the modulated carrier signal and generates a delayed modulated carrier signal. An upconverter module 256 upconverts the delayed signal. A transmitter 257 generates a control signal for a control terminal of a power amplifier 264 based on the delayed modulated carrier signal. An inductance 260 may be connected between the boost capacitor $C_{boost}$ and a first terminal of the power amplifier 264. A matching network 266 is coupled to the first terminal and to an antenna 268. In FIG. 10B, the digital transmit signal is rectified (for example at 300) and an analog envelope signal is generated as shown. The voltage bias to the amplifier selectively increases above $V_{dd}$ as needed to prevent clipping.

Figure 11A:
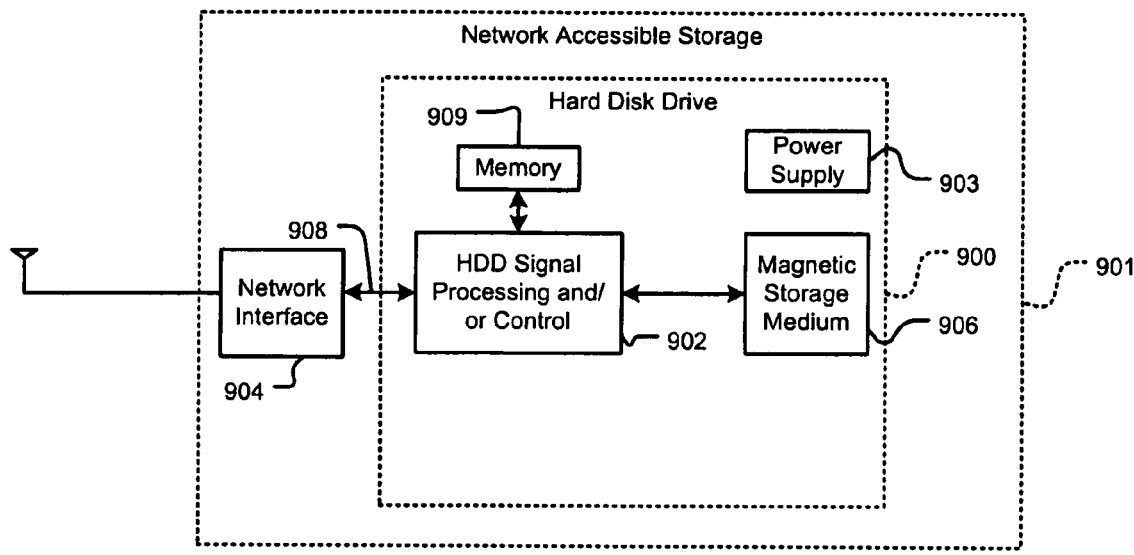
FIG. 11A is an exemplary implementation of the present invention in a network accessed storage module.

Referring now to FIGS. 11A-11G, various exemplary implementations of the present invention are shown. Referring now to FIG. 11A, the present invention can be implemented in a network accessed storage module (NAS) 901 that includes a hard disk drive 900. The present invention may implement and/or be implemented in a wireless network interface module, which is generally identified in FIG. 11A at 904. In some implementations, signal processing and/or control circuit 902 and/or other circuits (not shown) in the HDD 900 may process data, communicate with the module 904, perform coding and/or encryption, perform calculations, and/or format data that is output to and/or received from a magnetic storage medium 906.

The HDD 900 may communicate with another networked device (not shown) such as a computer, a mobile computing device such as a personal digital assistant, cellular phone, media or MP3 player and the like, and/or other device via one or more wired links 908 and/or the module 904. The HDD 900 may be connected to memory 909 such as random access memory (RAM), low latency nonvolatile memory such as flash memory, read only memory (ROM) and/or other suitable electronic data storage. The HDD 900 may also include a power supply module 903.

Figure 11B:
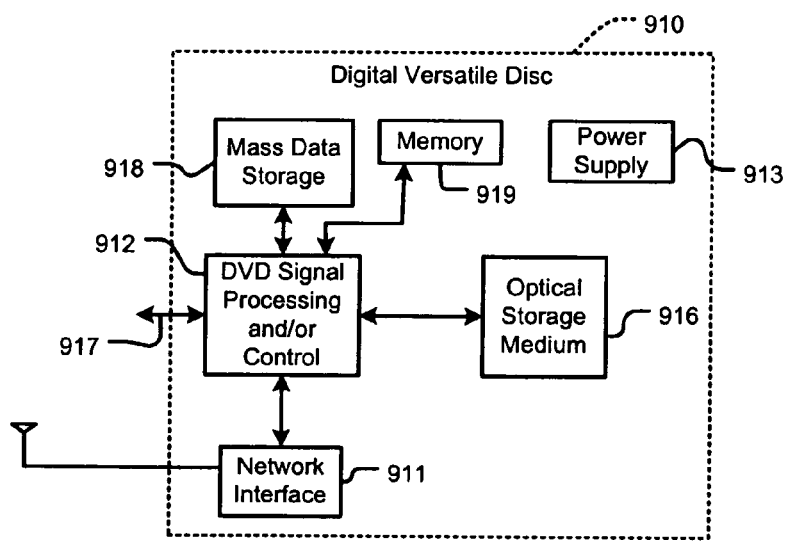
FIG. 11B is an exemplary implementation of the present invention in a digital versatile disc drive.

Referring now to FIG. 11B, the present invention can be implemented in a digital versatile disc (DVD) drive 910. The present invention may implement and/or be implemented in wireless network interface module, which is generally identified in FIG. 11B at 911. Signal processing and/or control circuit 912 and/or other circuits (not shown) in the DVD drive 910 may process data, perform coding and/or encryption, perform calculations, and/or format data that is read from and/or data written to an optical storage medium 916. In some implementations, the signal processing and/or control circuit 912 and/or other circuits (not shown) in the DVD drive 910 can also perform other functions such as encoding and/or decoding and/or any other signal processing functions associated with a DVD drive.

The DVD drive 910 may communicate with an output device (not shown) such as a computer, television or other device via one or more wired links 917 and/or wireless links via the module 911. The DVD drive 910 may communicate with mass data storage 918 that stores data in a nonvolatile manner. The mass data storage 918 may include a hard disk drive (HDD). The HDD may have the configuration shown in FIG. 11A. The HDD may be a mini HDD that includes one or more platters having a diameter that is smaller than approximately 1.8". The DVD drive 910 may be connected to memory 919 such as RAM, ROM, low latency nonvolatile memory such as flash memory and/or other suitable electronic data storage. The DVD drive 910 may also include a power supply 913.

Figure 11C:
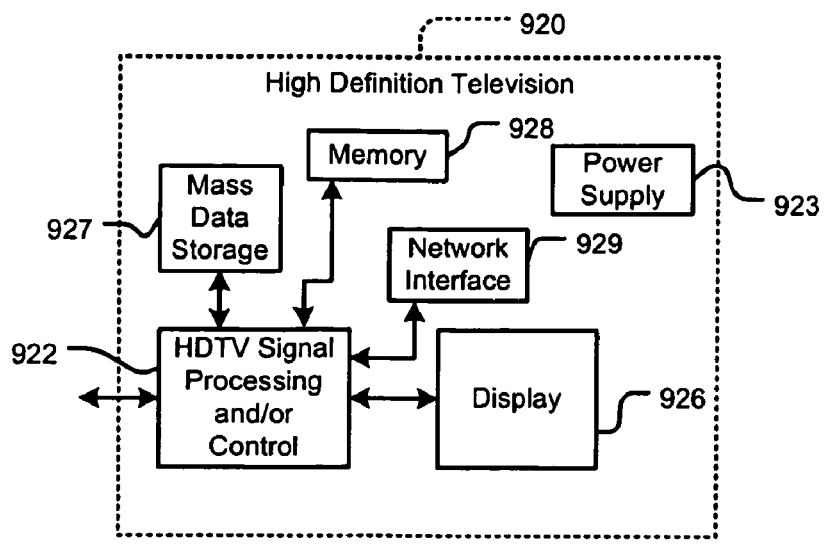
FIG. 11C is an exemplary implementation of the present invention in a high definition television.

Referring now to FIG. 11C, the present invention can be implemented in a high definition television (HDTV) 920. The present invention may implement and/or be implemented in either or both signal processing and/or control circuits, which are generally identified in FIG. 11E at 922, and a wireless network interface module 929.

The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may include a power supply 923.

Figure 11D:
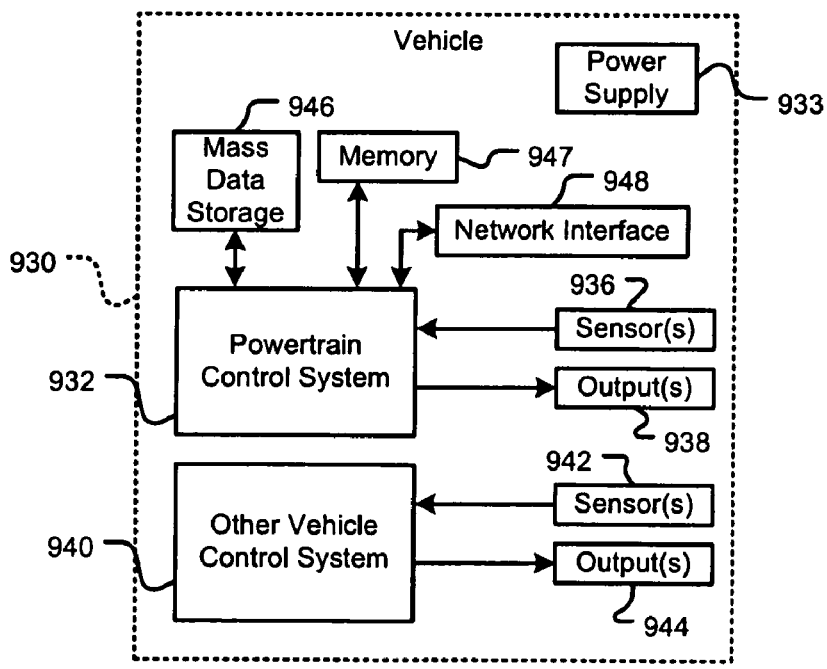
FIG. 11D is an exemplary implementation of the present invention in a wireless local area network device associated with a vehicle.

Referring now to FIG. 11D, the present invention may implement and/or be implemented in a wireless network interface module 948 of a vehicle 930. A powertrain control system 932 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. Vehicle 930 may also include a power supply 933.

Figure 11E:
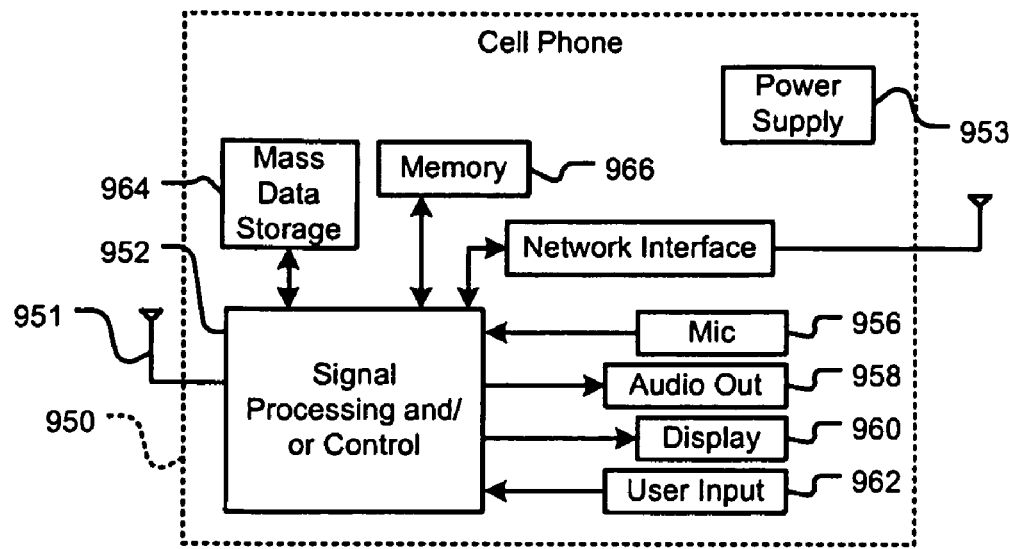
FIG. 11E is an exemplary implementation of the present invention in a cellular phone.

Referring now to FIG. 11E, the present invention can be implemented in a cellular phone 950 that may include a cellular antenna 951. The present invention may implement and/or be implemented in a wireless network interface module 968. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. Cellular phone 950 may also include a power supply 953.

Figure 11F:
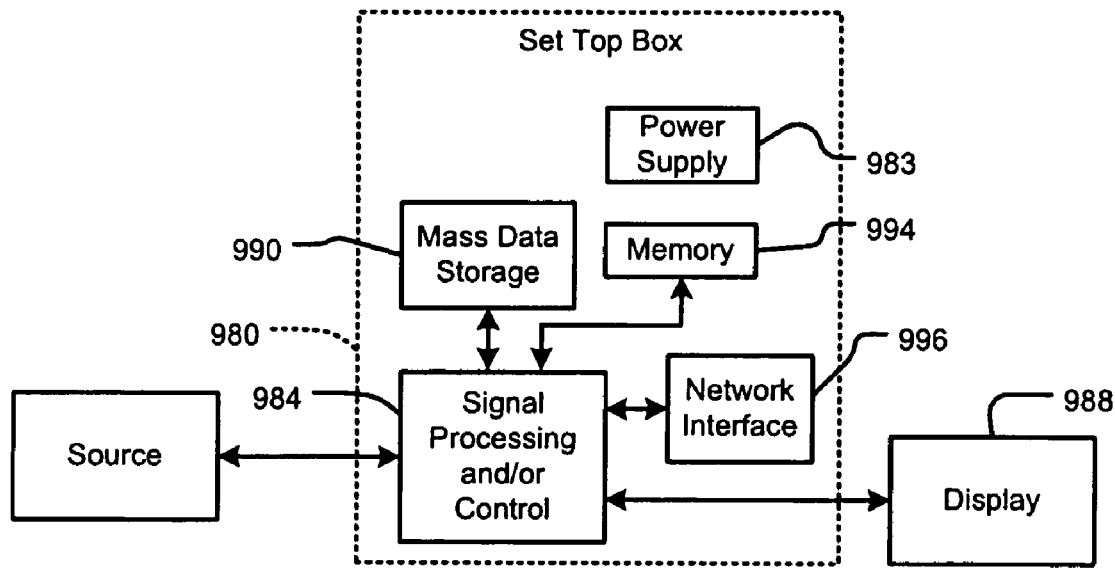
FIG. 11F is an exemplary implementation of the present invention in a set top box.

Referring now to FIG. 11F, the present invention can be implemented in a set top box 980. The present invention may implement and/or be implemented in a network interface module 996. The set top box 980 receives signals from a source such as a broadband source and outputs standard and/or high definition audio/video signals suitable for a display 988 such as a television and/or monitor and/or other video and/or audio output devices. The source may be connected to the set top box 980 via the network interface module 996. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. Set top box 980 may also include a power supply 983.

Figure 11G:
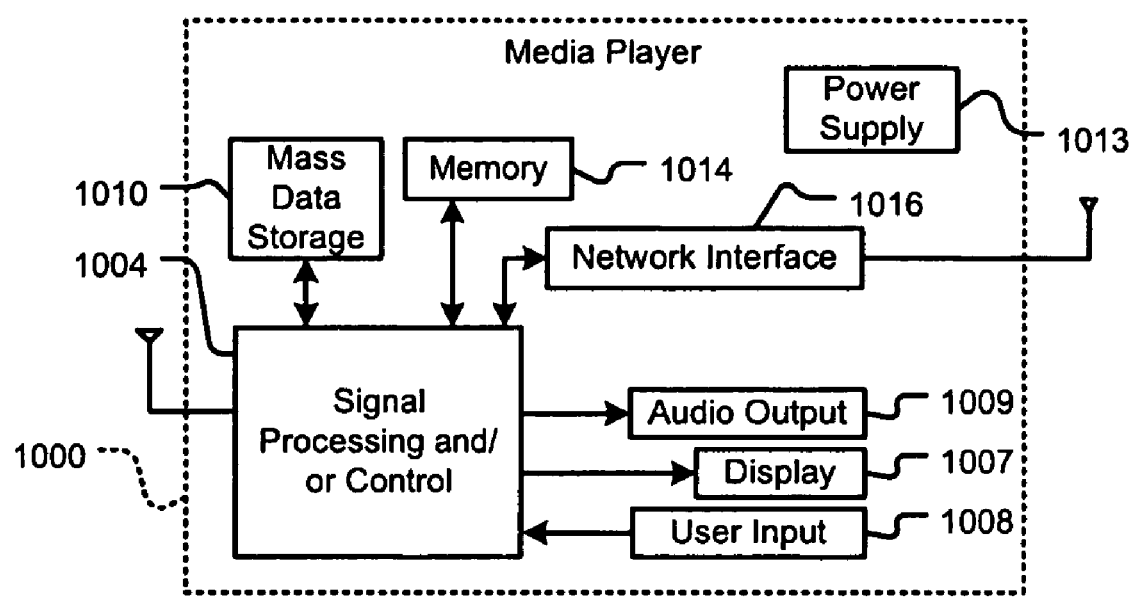
FIG. 11G is an exemplary implementation of the present invention in a media player.

Referring now to FIG. 11G, the present invention can be implemented in a media player 1000. The present invention may implement and/or be implemented in a wireless network interface 1016. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 1000 may be connected to memory 514 such as RAM, ROM, low latency nonvolatile memory such as flash memory and/or other suitable electronic data storage. Media player 1000 may also include a power supply 1013. Still other implementations in addition to those described above are contemplated.

While an amplifier 162 is shown, any analog output circuit that requires a bias voltage and/or current can be used. The present invention saves power by generally lowering the required supply voltage while selectively increasing the supply voltage as needed. As a result, the dynamic range of the circuit is improved without significantly increasing power dissipation.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A circuit comprising:
   a delay module that receives a digital transmit signal and that generates a delayed transmit signal;
   a first digital to analog converter that converts said delayed transmit signal to an analog transmit signal;
   an analog output circuit that receives said analog transmit signal;
   an envelope generating module that generates a digital envelope signal based on amplitude information related to said digital transmit signal;
   a supply adjustment module that supplies a voltage supply reference when said digital envelope signal is less than said voltage supply reference and that boosts a bias voltage of said analog output circuit to a voltage level that is greater than a voltage level of said digital envelope signal when said digital envelope signal is greater than said voltage supply reference;

a second digital to analog converter that converts said digital envelope signal to an analog envelope signal, wherein said first digital to analog converter has a higher resolution than said second digital to analog converter; and a third digital to analog converter that receives said digital envelope signal and generates an analog output signal and that selectively boosts a bias current for said analog output circuit based on said analog output signal.

2. The circuit of claim 1, wherein said bias current increases when said digital envelope signal exceeds said voltage supply reference.

3. A wired network interface comprising the circuit of claim 1.

4. A wireless network interface comprising the circuit of claim 1.

5. The wireless network interface of claim 4, wherein said wireless network interface is compliant with at least one of IEEE section 802.11, 802.11a, 802.11b, 802.11g, 802.11h, 802.11n, 802.16, and 802.20.

6. The circuit of claim 1, wherein said envelope generating module receives said digital transmit signal and generates said digital envelope signal based on said digital transmit signal.

7. The circuit of claim 1, wherein a rise time of said digital envelope signal is slower than a fastest rise time of said analog transmit signal.

8. The circuit of claim 1 wherein said envelope generating module generates said envelop signal based on voltage amplitude of the digital transmit signal.

9. The circuit of claim 1, wherein said supply adjustment module comprises:
a switch that is connected to said analog output circuit and that receives said voltage supply reference; and
a capacitance that is connected between said first digital to analog converter and said switch.

10. The circuit of claim 9, wherein said switch is in a first state when said supply adjustment module biases said analog output circuit with said voltage supply reference, and
wherein said switch is in a second state when said supply adjustment module biases said analog output circuit with said voltage level that is greater than said voltage level of said envelope signal.

11. The circuit of claim 9, wherein said switch is directly connected to said capacitance.

12. The circuit of claim 9, wherein said switch and said capacitance are directly connected to said analog output circuit.

13. The circuit of claim 9, wherein said capacitance is directly connected to said first digital to analog converter.

14. A circuit comprising:
a delay module that receives a digital transmit signal and that generates a delayed transmit signal;
a first digital to analog converter that converts said delayed transmit signal to an analog transmit signal;
an analog output circuit that receives said analog transmit signal;
a supply boost module that samples a signal including amplitude information of said digital transmit signal and that selectively boosts a voltage supply reference supplied to said analog output circuit before a corresponding portion of said analog transmit signal is received by said analog output circuit based on a difference between said sampled signal and said voltage supply reference, wherein said supply boost module includes:
an envelope generating module that generates a digital envelope signal;
a second digital to analog converter that converts said digital envelope signal to an analog envelope signal; and
a supply adjustment module that supplies said voltage supply reference when said digital envelope signal is less than said voltage supply reference and that boosts a bias voltage of said analog output circuit to a voltage level that is greater than said voltage supply reference when said digital envelope signal exceeds said voltage supply reference; and
a third digital to analog converter that receives said digital envelope signal and that generates a bias current for said analog output circuit.

15. The circuit of claim 14, wherein said first digital to analog converter has a higher resolution than said second digital to analog converter.

16. The circuit of claim 14, wherein said bias current increases when said digital envelope signal exceeds said voltage supply reference.

17. A wired network interface comprising the circuit of claim 14.

18. A wireless network interface comprising the circuit of claim 14.

19. The wireless network interface of claim 18, wherein said wireless network interface is compliant with at least one of IEEE section 802.11, 802.11a, 802.11b, 802.11g, 802.11h, 802.11n, 802.16, and 802.20.

20. The circuit of claim 14, wherein said envelope generating module receives said digital transmit signal and generates said envelope signal based on said digital transmit signal.

21. The circuit of claim 14, wherein said digital envelope signal has a rise time that is slower than a fastest rise time of said analog transmit signal.

22. The circuit of claim 14, wherein said analog output circuit receives a differential bias and wherein said supply boost module one of symmetrically and asymmetrically biases said analog output circuit.

23. A method comprising:
receiving a digital transmit signal;
generating a delayed transmit signal;
converting said delayed transmit signal to an analog transmit signal;
receiving said analog transmit signal at an analog output circuit;
generating a digital envelope signal based on amplitude information related to said digital transmit signal;
supplying a voltage supply reference when said digital envelope signal is less than said voltage supply reference;
boosting a bias voltage of said analog output circuit to a voltage level that is greater than a voltage level of said digital envelope signal when said digital envelope signal is greater than said voltage supply reference;
converting said digital envelope signal to a first analog envelope signal;
converting said first analog envelope signal to a second analog envelope signal with said bias voltage; and
selectively boosting a bias current for said analog output circuit based on said second analog envelope signal.

24. The method of claim 23, wherein said bias current increases when said digital envelope signal exceeds said voltage supply reference.

25. The method of claim 23, wherein said digital envelope signal is based on said digital transmit signal.

26. The method of claim 23, wherein said digital envelope signal has a rise time that is slower than a fastest rise time of said analog transmit signal.

27. The method of claim 23, further comprising one of symmetrically and asymmetrically biasing said analog output circuit.

28. A method comprising:
receiving a digital transmit signal;
generating a delayed transmit signal;
converting said delayed transmit signal to an analog transmit signal;
receiving said analog transmit signal at an analog output circuit;
sampling a signal that includes amplitude information of said transmit signal and selectively boosting a voltage supply reference supplied to said analog output circuit before a corresponding portion of said analog transmit signal is received by said analog output circuit based on a difference between said sampled signal and said voltage supply reference;
generating a digital envelope signal;
converting said digital envelope signal to an analog envelope signal;
supplying said voltage supply reference when said digital envelope signal is less than a threshold and boosting a bias voltage of said analog output circuit to a voltage level that is greater than said voltage supply reference when said digital envelope signal exceeds said threshold;
converting said digital envelope signal to an analog output signal; and
generating a bias current for said analog output circuit.

29. The method of claim 28, further comprising increasing said bias current when said digital envelope signal exceeds said threshold.

30. The method of claim 28, wherein said digital envelope signal is based on said digital transmit signal.

31. The method of claim 28, wherein said voltage supply reference has a rise time that is slower than a fastest rise time of said analog transmit signal.

32. The method of claim 28, further comprising one of symmetrically and asymmetrically biasing said analog output circuit.

33. A circuit comprising:
a delay module that receives a digital transmit signal and that generates a delayed transmit signal;
a first digital to analog converter that converts said delayed transmit signal to an analog transmit signal;
an analog output circuit that receives said analog transmit signal;
an envelope generating module that generates an envelope signal based on amplitude information related to said digital transmit signal; and
a supply adjustment module that supplies a voltage supply reference when said envelope signal is less than said voltage supply reference and that boosts a bias voltage of said analog output circuit to a voltage level that is greater than a voltage level of said envelope signal when said envelope signal is greater than said voltage supply reference,
wherein said analog output circuit receives a differential bias and wherein said supply adjustment module one of symmetrically and asymmetrically biases said analog output circuit.

34. A circuit comprising:
a delay module that receives a digital transmit signal and that generates a delayed transmit signal;
a first digital to analog converter that converts said delayed transmit signal to an analog transmit signal;
an analog output circuit that receives said analog transmit signal;
an envelope generating module that generates an envelope signal based on amplitude information related to said digital transmit signal; and
a supply adjustment module that supplies a voltage supply reference when said envelope signal is less than said voltage supply reference and that boosts a bias voltage of said analog output circuit to a voltage level that is greater than a voltage level of said envelope signal when said envelope signal is greater than said voltage supply reference,
wherein said supply adjustment module comprises:
a first switch that is connected to said analog output circuit and that receives said voltage supply reference at a first polarity;
a second switch that is connected to said analog output circuit and that receives said voltage supply reference at a second polarity;
a first capacitance that is connected between said first digital to analog converter and said first switch; and
a second capacitance that is connected between a second digital to analog converter and said second switch.

* * * * *